(12) United States Patent
Shieh et al.

(10) Patent No.: US 10,410,913 B2
(45) Date of Patent: Sep. 10, 2019

(54) MULTI-LAYER METAL CONTACTS

(71) Applicant: Taiwan Semiconductor Manufacturing Company, Ltd., Hsin-Chu (TW)

(72) Inventors: Ming-Feng Shieh, Yongkang (TW); Wen-Hung Tseng, Luodong Township (TW); Chih-Ming Lai, Hsinchu (TW); Ken-Hsien Hsieh, Taipei (TW); Tsai-Sheng Gau, HsinChu (TW); Ru-Gun Liu, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/149,500

(22) Filed: May 9, 2016

(65) Prior Publication Data

US 2016/0254183 A1    Sep. 1, 2016

Related U.S. Application Data

(63) Continuation of application No. 13/911,183, filed on Jun. 6, 2013, now Pat. No. 9,337,083.

(60) Provisional application No. 61/775,642, filed on Mar. 10, 2013.

(51) Int. Cl.
*H01L 21/768* (2006.01)
*H01L 29/417* (2006.01)

(52) U.S. Cl.
CPC .. *H01L 21/76816* (2013.01); *H01L 21/76895* (2013.01); *H01L 21/76897* (2013.01); *H01L 29/41725* (2013.01)

(58) Field of Classification Search
CPC ......... H01L 21/76804; H01L 21/76816; H01L 21/768–76898
See application file for complete search history.

(56) References Cited

U.S. PATENT DOCUMENTS

| 5,879,986 | A | * | 3/1999 | Sung | H01L 27/10852 |
| | | | | | 257/E21.648 |
| 6,777,343 | B2 | * | 8/2004 | Park | H01L 21/76897 |
| | | | | | 438/723 |
| 9,337,083 | B2 | * | 5/2016 | Shieh | H01L 21/76895 |
| 2005/0085072 | A1 | | 4/2005 | Kim et al. | |
| 2009/0014796 | A1 | * | 1/2009 | Liaw | H01L 27/11 |
| | | | | | 257/347 |
| 2009/0321795 | A1 | * | 12/2009 | King | H01L 21/28052 |
| | | | | | 257/288 |
| 2012/0032275 | A1 | | 2/2012 | Haran et al. | |
| 2012/0098073 | A1 | * | 4/2012 | Yu | H01L 21/76802 |
| | | | | | 257/413 |
| 2013/0049219 | A1 | * | 2/2013 | Tsai | H01L 21/28518 |
| | | | | | 257/774 |
| 2014/0252433 | A1 | | 9/2014 | Shieh et al. | |

* cited by examiner

*Primary Examiner* — Stephen M Bradley
(74) *Attorney, Agent, or Firm* — Haynes and Boone, LLP

(57) ABSTRACT

A method for forming metal contacts within a semiconductor device includes forming a first-layer contact into a first dielectric layer that surrounds at least one gate electrode, the first-layer contact extending to a doped region of an underlying substrate. The method further includes forming a second dielectric layer over the first dielectric layer and forming a second-layer contact extending through the second dielectric layer to the first-layer contact.

20 Claims, 5 Drawing Sheets

MULTI-LAYER METAL CONTACTS

The present application is a continuation of U.S. application Ser. No. 13/911,183 filed on Jun. 6, 2013, which claims priority to U.S. Application. No. 61/775,642 filed on Mar. 10, 2013, each of which is hereby incorporated by reference in its entirety.

BACKGROUND

Semiconductor integrated circuits can include a variety of components, including transistors. Such circuits can also include metal lines and contacts that connect the components in the desired manner in order to form a functional, interconnected, and integrated circuit. Fabrication of such circuitry is often done layer upon layer on a semiconductor substrate, e.g., starting with a semiconductor wafer.

For example, a transistor can be formed on and in a semiconductor substrate to include a gate structure on the substrate and doped source and drain structures in the substrate. The structures are then covered and surrounded by an interlayer dielectric layer. Holes are formed through the interlayer dielectric layer extending down to the gate structure as well as the doped source and drain structures. These holes are then filled with a conductive material to form interconnects (also referred to as contacts or vias) for connection to one or more other circuit components, as needed.

Forming the holes to be filled with conductive material does not create a straight cylindrical shaped hole. Rather, the hole becomes narrower the deeper it extends. Because the gates and doped regions are at different heights, the holes for the doped region and the holes for the gates may have different sizes. Specifically, because the holes extending to the doped region are deeper, they may be wider on the top than the holes that extend to the gate electrodes.

The difference in hole size has an effect on pattern design. Particularly, the critical dimension, which relates to the amount of space allowed between holes, can be different for the holes that extend to the doped regions from the holes that extend to the gates. It is desirable to reduce this difference to allow for better overlay budget and critical dimension control.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIGS. 1A-1E are diagrams showing an illustrative process for forming metal contacts within a semiconductor device. FIGS. 1A-1E each illustrate three different views of the same device at a particular instance in the process. In each figure, the left column 102 illustrates a cross sectional view along a first (x) direction, the middle column 104 illustrates a top view, and the right column 106 illustrates a cross sectional view along a second (y) direction.

Figure 1A:
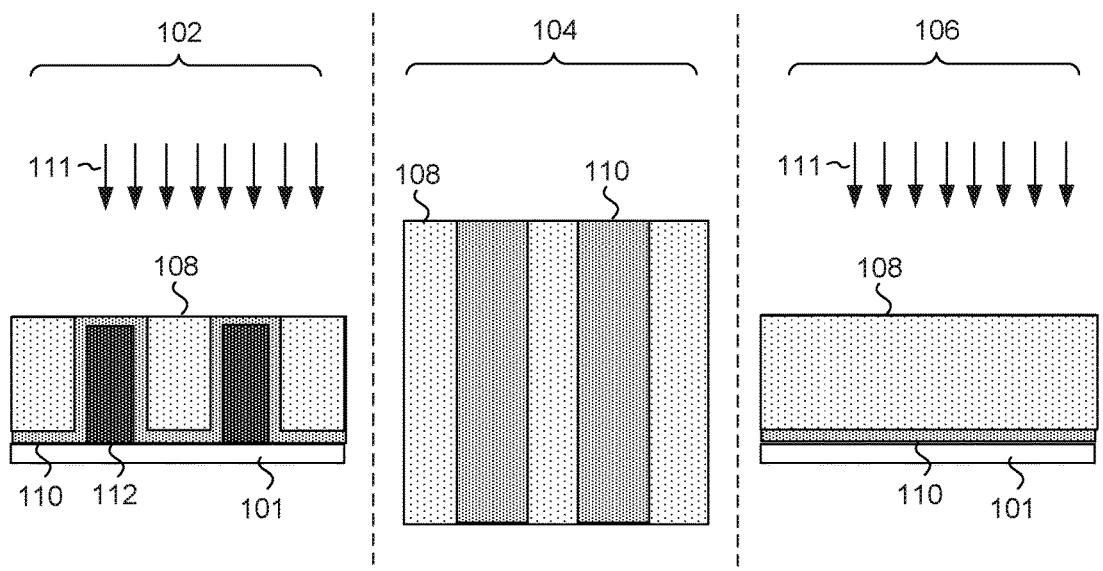
FIGS. 1A-1E are diagrams showing an illustrative process for forming metal contacts within a semiconductor device, according to one example of principles described herein.

FIG. 1A illustrates the formation of a first dielectric layer 108 around a number of gate electrodes 112. The gate electrodes 112 are formed on top of a substrate 101. Additionally, a hard mask layer 110 is formed over the gate electrodes 112. While the substrate 101 includes doped regions adjacent to the gate electrodes 112, such regions are not shown here to simplify the discussion.

According to certain illustrative examples, the substrate 101 may include, among other things, a silicon wafer. Alternatively or additionally, the substrate 101 may include another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the substrate 101 may also include a dielectric layer, a conducting layer, or combination thereof.

According to certain illustrative examples, the first dielectric layer 108 may be formed of a non-low-k dielectric material having a k value greater than 3.9, such as silicon oxide ($SiO_2$), silicon nitride (SiN), or silicon oxynitride (SiON). In an embodiment, the first dielectric layer 108 is formed of an oxide such as un-doped silicate glass (USG), boron-doped silicate glass (BSG), phosphorous-doped silicate glass (BSG), boron-doped phospho-silicate glass (BPSG), or the like. The first dielectric layer 108 may also be formed of a silicon oxide layer and a silicon nitride layer on the silicon oxide layer. The first dielectric layer 108 may alternatively be formed of a low-k dielectric material having a k value less than 3.9, such as fluorine-doped silicon oxide, carbon-doped silicon oxide, porous silicon oxide, porous carbon-doped silicon oxide, organic polymers, or silicone based polymers. In these embodiments, the first dielectric layer 108 may be formed using a chemical vapor deposition (CVD) or a physical vapor deposition (PVD) process.

According to certain illustrative examples, the gate electrodes 112 may be high k metal gates. While some gates are made of materials such as polysilicon, other gates may be made of metal. Such metal gates include a high-k dielectric material between the gate and the substrate. To form such gates, a dummy gate is formed onto the substrate. After a hard mask layer is formed around the dummy gates, the dummy gates can be removed and the high-k dielectric material and metal material can be filled within the space left by the removed dummy gate.

FIG. 1A also illustrates the first dielectric layer after a planarizing process 111 has been used such as a Chemical-Mechanical Polishing (CMP) process. The planarizing process 111 can remove excess dielectric material to expose the top of the hard mask material 110 formed over the gates 112.

According to the present example, the gate electrodes 112 are fin shaped. Specifically, they form an elongated shape. As can be seen from the top view 104, the exposed hard mask material 112 around the gate electrodes 112 runs in two parallel lines, one for each gate electrode 112. In the y-directional view 106, only the dielectric layer 108 is shown at this particular cross-section. In the x-directional view 102, the two gate electrodes 112 are shown with the surrounding hard mask material 110.

Figure 1B:
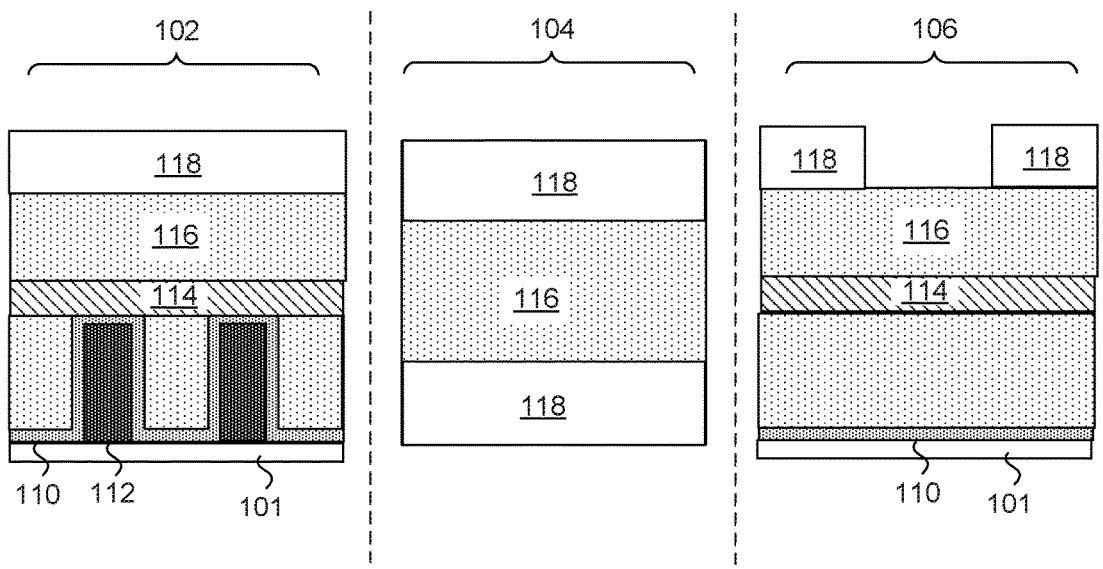

FIG. 1B illustrates the formation of an etching stop layer 114 on top of the first dielectric layer 108, the formation of a temporary dielectric layer 116 on top of the etching stop layer 114, and the formation of a photo-resist material 118 on top of the temporary dielectric layer 116. The etching stop layer 114 is used to aid in the etching process used to form metal contacts that connect to the gate electrodes 112 or doped regions within the substrate 101. According to certain illustrative examples, the etching stop layer 114 may include silicon nitride or silicon oxynitride.

According to certain illustrative examples, the photo-resist material 118 may be a positive-type material or a negative-type material. The photo-resist material 118 is used to pattern a first layer-contact into the first dielectric layer 108. The first dielectric layer 108 is patterned by a photolithography process. An exemplary photolithography process may include processing steps of photoresist coating 118, soft baking, mask aligning, exposing, post-exposure baking, developing photoresist and hard baking. The lithography process may implement krypton fluoride (KrF) excimer lasers, argon fluoride (ArF) excimer lasers, ArF immersion lithography, extreme ultra-violet (EUV) or electron-beam writing (e-beam). The photolithography exposing process may also be implemented or replaced by other proper methods such as maskless photolithography, ion-beam writing, and molecular imprint. When applying the developing solution to the exposed photoresist layer 118, the sacrificial layer underlying the exposed photoresist region (for positive photoresist) is partially or completely removed as well.

In the present example, the first-layer contact is to run perpendicular to the fin shaped gate electrodes 112.

Figure 1C:
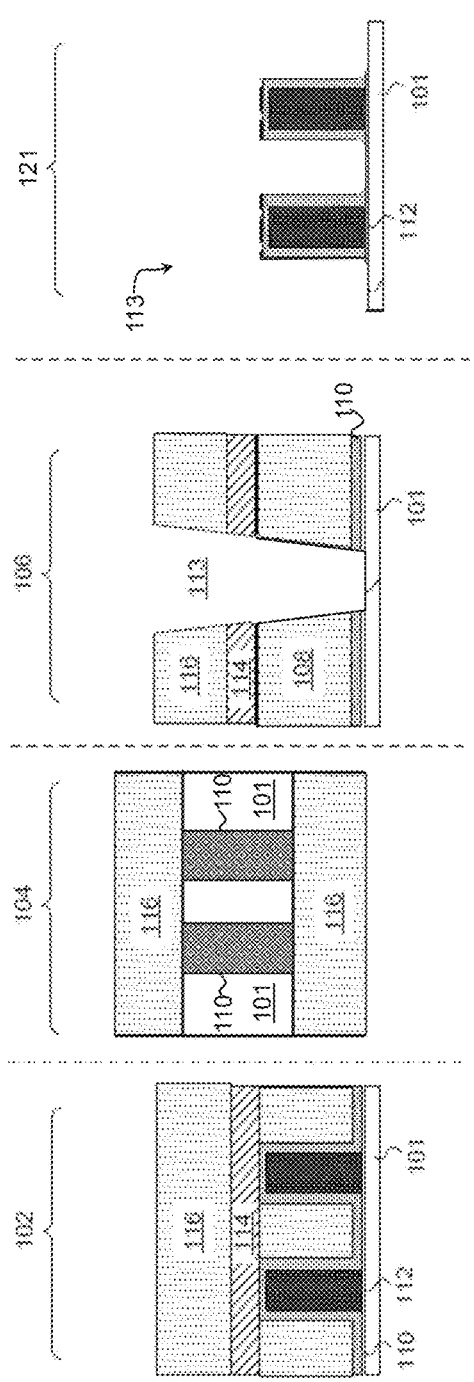

FIG. 1C illustrates the device after an etching process and removal of the photo-resist material 118. The etching process affects the regions exposed by the photo-resist material 118. Specifically, a hole 113 is etched down to the hard mask layer 110. Thus, the material that forms the hard mask layer 110 is selective with the material that forms the dielectric layers 108, 116 being etched away.

Because the hole 113 runs perpendicular to a portion of the gate electrodes 112, FIG. 1C includes and additional x-directional view 121 depicting the hole 113. In the top view 104 and the x-directional view 121, the hole 113 can be seen as exposing the hard mask layer 110 over the gate electrodes 112 and exposing the substrate 101. Specifically, the etching process occurs down to the hard mask layer 110 surrounding the gate electrodes 112 and the hard mask layer 110 deposited along the substrate 101, which is removed t expose the substrate 101. The y-directional view 106 illustrates the hole 113 extending down to the substrate 101. Due to standard etching processes, the hole 113 does not go straight down. Rather, the hole 113 becomes narrower as it extends deeper.

Figure 1D:
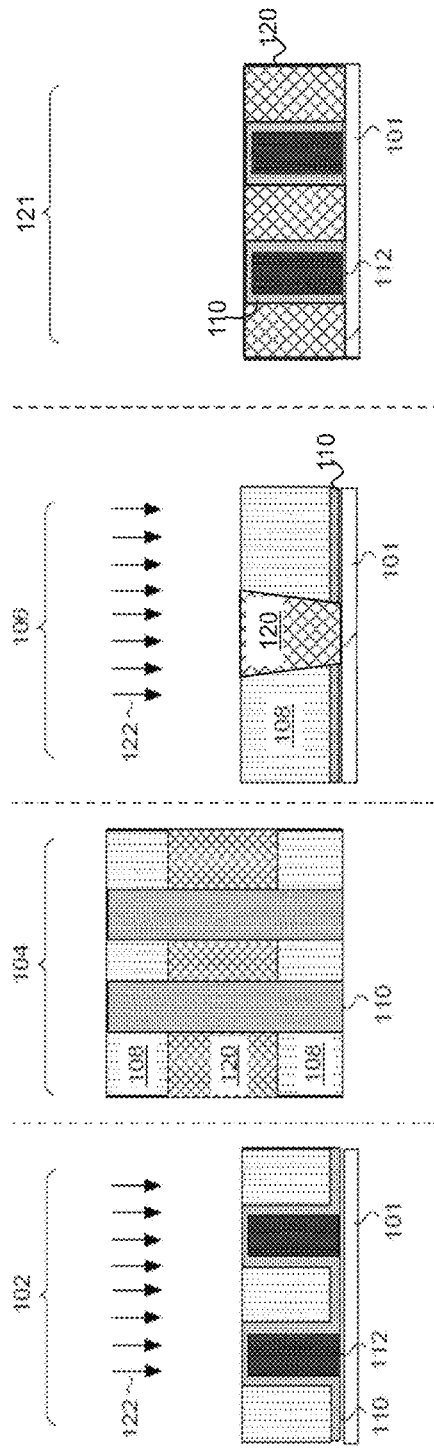

FIG. 1D illustrates a CMP process 122 after the hole has been filled with a metal material to form a metal contact 120. The metal contact can include various materials, including barrier layers and seed layers. For example, the metal contact 120 may include titanium nitride (TiN), tantalum nitride (TaN) or platinum (Pt). In addition, the metal contact may include various fill materials, such as tungsten, copper, aluminum or combinations thereof. The metal contact 120 can be formed by atomic layer deposition (ALD), physical vapor deposition (PVD or sputtering), or alternatively other suitable processes.

According to the present example, the CMP process 122 grinds down the device until the hard mask layer 110 on top of the gate electrodes 112 is exposed. This grinding removes the temporary dielectric layer 116, the etch stop layer 114, and any metal material above the gate electrodes 112. This leaves a first-layer metal contact 120 at desired regions within the semiconductor device.

The metal contact 120 can be seen from the x-directional view 121. From the top view 104, and the x-directional view 121, the metal contact can be seen between the gate electrodes 112. The metal contact 120 can also be seen from the y-directional view 106.

Figure 1E:
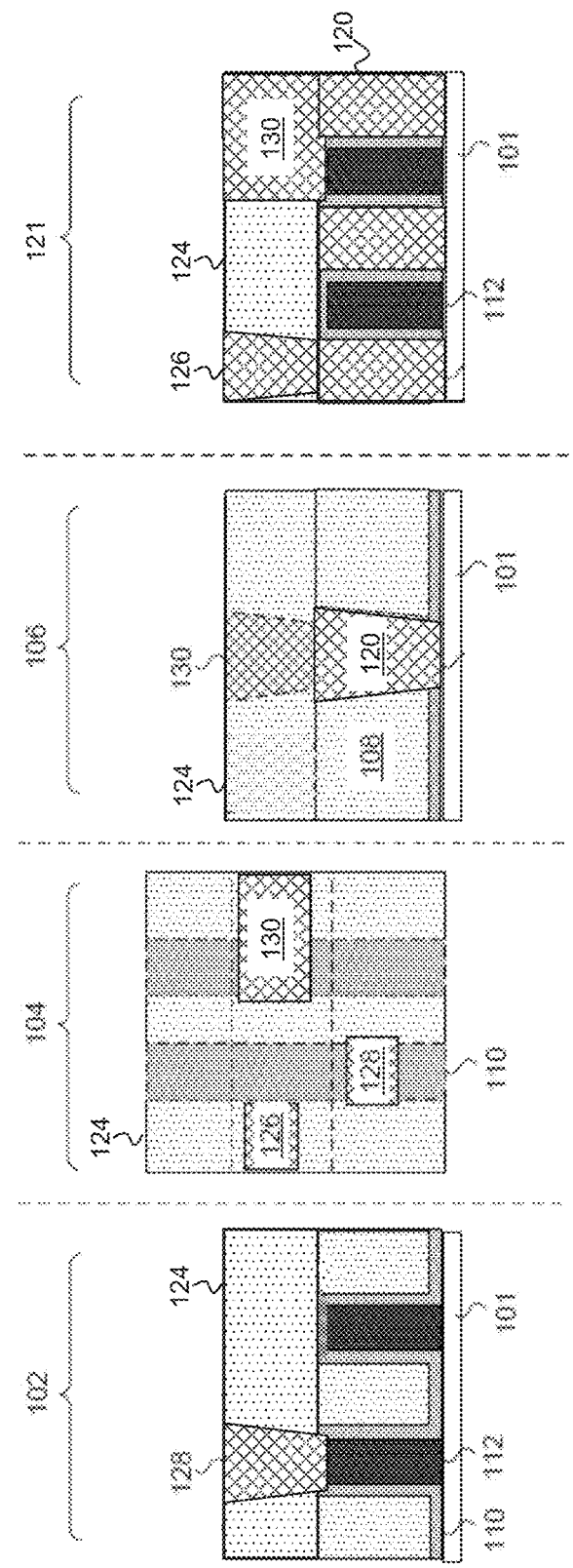

FIG. 1E illustrates the formation of second-layer contacts 126, 128, 130 formed into a second dielectric layer 124 that is formed over the first dielectric layer 108. The second-layer metal contact may include material similar to or different from those discussed above with reference to the first-metal layer contact. According to the present example, a second-layer metal contact 126 is formed over the first-metal layer contact only. Thus, the combination of the first-layer metal contact 120 and the second-layer metal contact form a full contact extending down to the doped region of the substrate. Such a metal contact 126 can be used to connect to a source or drain terminal of a transistor.

According to the present example, a second-layer metal contact 128 is formed through the second dielectric layer 124 down to a gate electrode 112. The contact extends through the hard mask layer 110 in order to contact the actual gate 112. This contact is positioned so that it does not make contact with any first-layer metal contact 120. This would cause a short in the circuit between the gate and the doped regions.

Additionally, a second-layer metal contact 130 is formed over both the gate electrode 112 and the first-layer metal contact 120. In some circuits, it is desirable to create a connection between a source or drain terminal of a transistor with the gate of the transistor. Such connections can be efficiently made with a second-layer metal contact 130 as illustrated here.

The x-directional view 102 illustrates the second-layer metal contact 128, and the x-directional view 121 illustrates the second-layer metal contacts 126, 130. The top view also illustrates each of the second-layer metal contacts 126, 128, 130. The y-directional view illustrates the second-layer metal contact 130 that extends to the first-layer metal contact 120. The x-directional view 102 illustrates the second-layer metal contact 128 that extends to the gate electrode 112 only, and the x-dimensional view 121 illustrates the second-layer metal contact 130 that extends to both the gate electrode 112 and the first-layer metal contact 120 and the second-layer metal contact 126 extends to the first-layer metal contact 120, such that the second-layer metal contact 126 can connect to a doped region, such as source or drain, in substrate 101, and the second-layer metal contact 130 can connect the gate electrode 112 and a doped region, such as source or drain, in substrate 101.

Each of the second-layer metal contacts 126, 128, 130 may be formed through standard lithographic processes. For example, a photo-resist material may be used to pattern the second dielectric layer 124. After exposure to a light source through a photo-mask and development of the photo-resist layer, holes can be formed at regions where the photo-resist layer was removed. These holes can then be filled with a metal material to form the second-layer metal contacts 126, 128, 130.

Figure 2A:
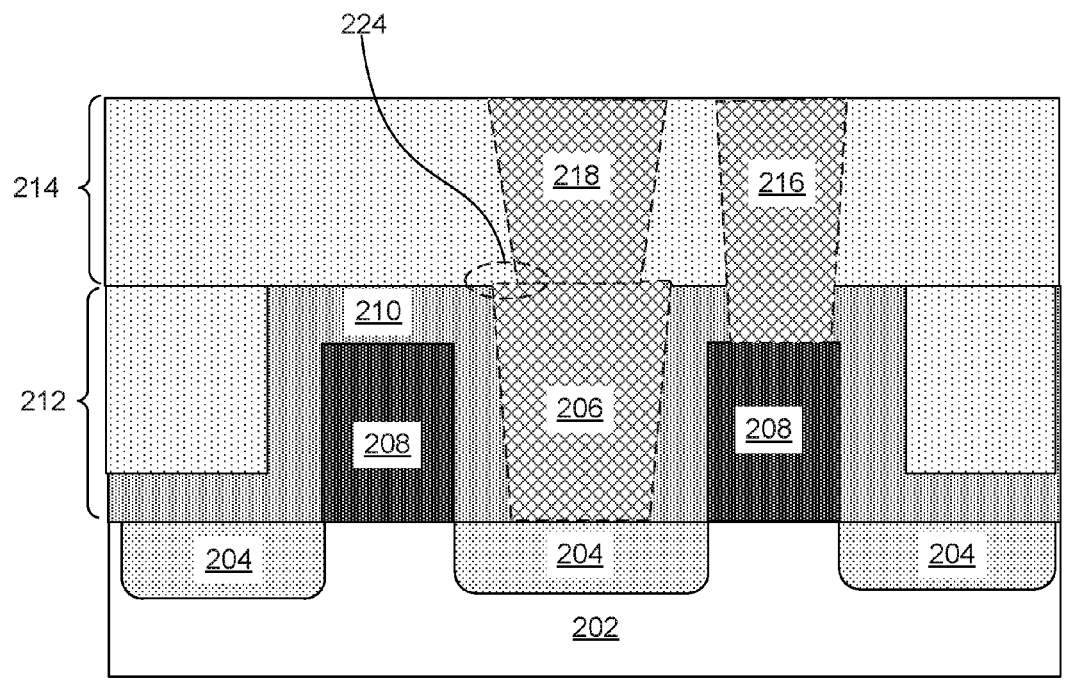
FIGS. 2A-2B are diagrams showing an illustrative semiconductor device with multi-layer contacts, according to one example of principles described herein.
Figure 2B:
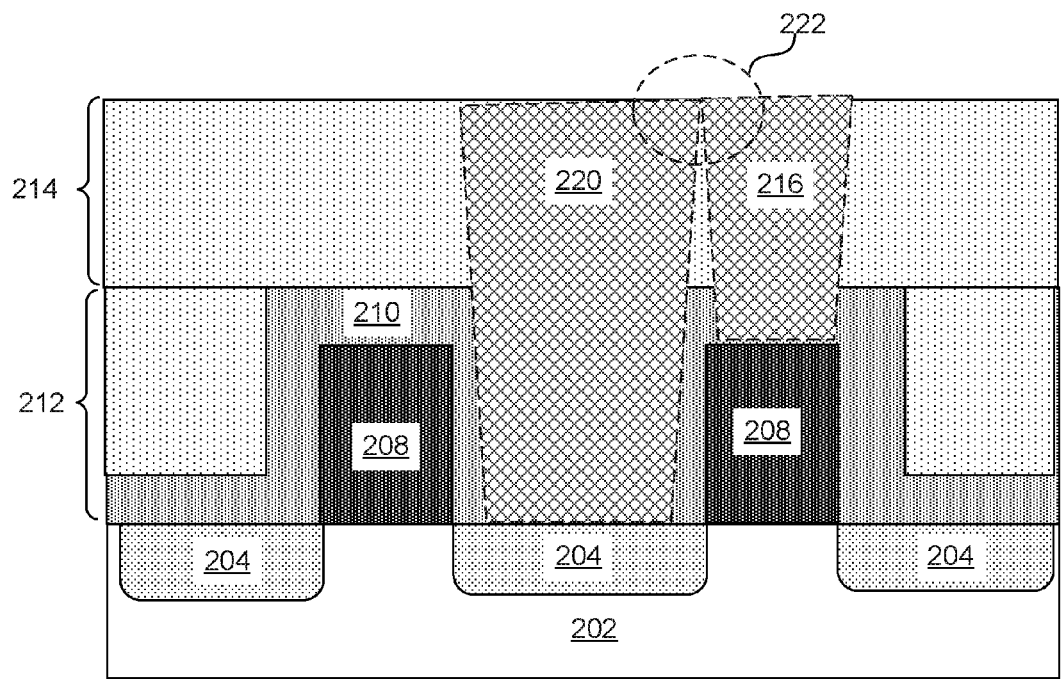

FIGS. 2A-2B are diagrams showing an illustrative semiconductor device with multi-layer contacts. FIG. 2A illustrates a multi-layer metal contact embodying principles described herein. In contrast, FIG. 2B illustrates a traditional method of forming metal contacts of varying heights that are formed in the same process.

FIG. 2A illustrates doped regions 204 formed into a substrate 202. The doped regions 204 are adjacent to the gate electrodes 208 so as to form complete transistors. Similar to the structure shown in FIGS. 1A-1E, the gates 208 are surrounded by a hard mask material 210. Additionally a first dielectric layer 212 surrounds the gate electrodes. A first-layer metal contact 206 is formed within the first dielectric layer 212. The first-layer metal contact extends down to a doped region 204.

A second dielectric layer 214 is formed on top of the first dielectric layer 212. The second-layer metal contacts 216, 218 are formed within the second dielectric layer 214. One second-layer contact 216 extends down to a gate electrode 208. The other second-layer contact 218 extends down to the first-layer metal contact 206.

In the present example, both of the second-layer metal contacts 216, 218 are formed in the same patterning process. Additionally, because the second-layer metal contact 218 that connects to the doped region 204 does not have to extend all the way down to the doped region 204, it can be made with a smaller size hold at the top. This allows for better overlay control. Particularly, the patterning of a device embodying principles herein can form components closer together because the hole extending down to the doped regions 204 does not have to be as large at the top.

Because the full contact that extends down to the doped regions 204 is formed in two separate processes, a step 224 is formed between the first-layer contact 206 and the second-layer contact 218. This step, however, has no substantial effect on the electrical connection between the first-layer contact 206 and the second-layer contact 218.

FIG. 2B illustrates traditional methods where the contact that connects to the doped region is formed in the same process as the contact that connects to the gate electrode 208. Because there is no first-layer metal contact over the doped region, the single-process second-layer contact 220 has a wider hole on top because the hole becomes narrower as it extends deeper. Because the contact 220 extends deeper than the contact 216 that connects to the gate electrode 208, the hole on top has to be wider. This can lead to a short circuit 222 if the contacts 216, 220 are placed close enough to each other that an electrical connection can be made.

In other words, the critical dimension at the top of the contact 220 is substantially different from the critical dimension at the bottom of the contact 220 due to the depth of the contact 220. In FIG. 2A, however, the critical dimension at the top of the metal contact 218 is substantially similar to the critical dimension at the top of the first-layer metal contact.

Figure 3:
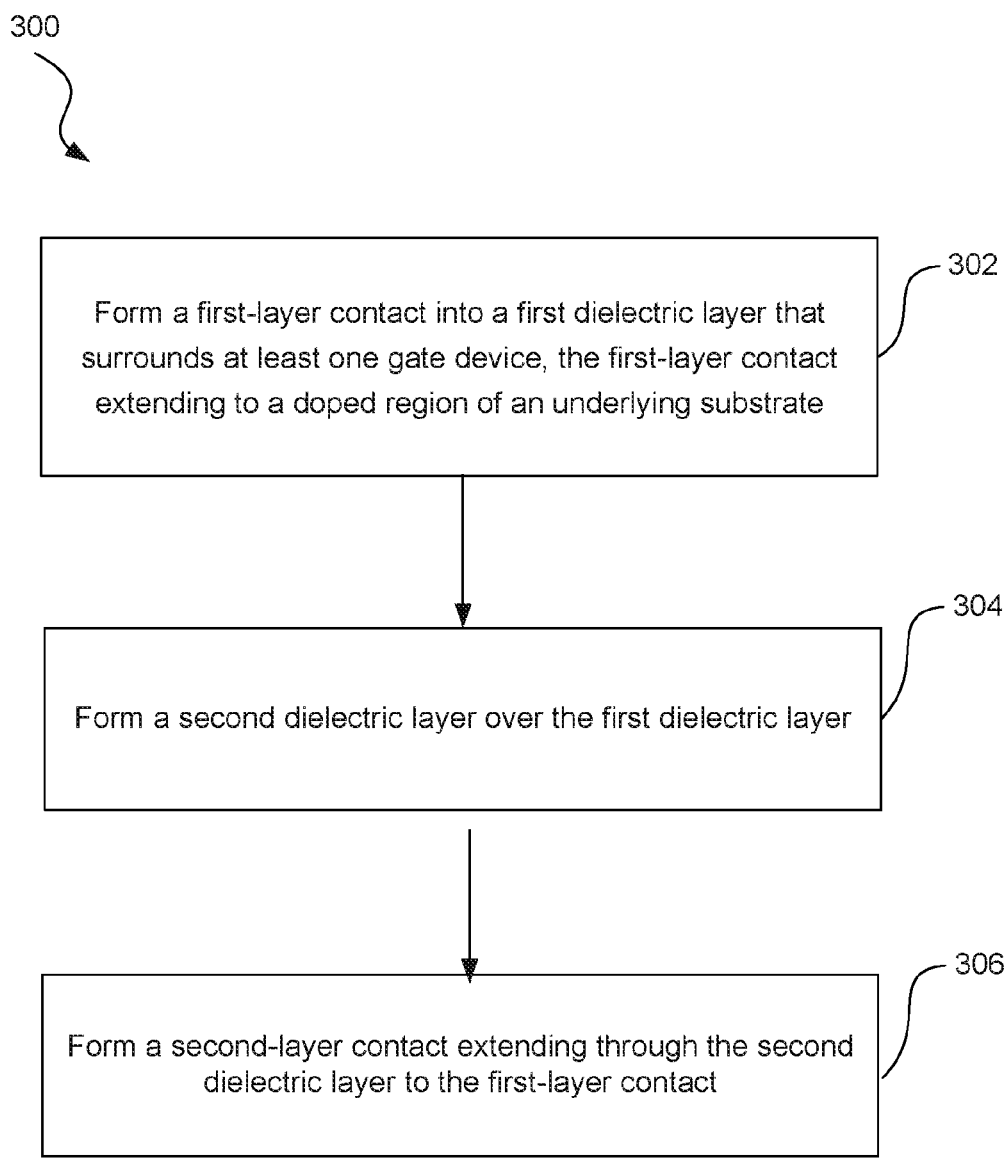
FIG. 3 is a flowchart showing an illustrative method for forming multi-layer metal contacts within a semiconductor device, according to one example of principles described herein.

FIG. 3 is a flowchart showing an illustrative method for forming multi-layer metal contacts within a semiconductor device. According to the present example, the method includes a step of forming 302 a first-layer contact into a first dielectric layer that surrounds at least one gate electrode, the first-layer contact extending to a doped region of an underlying substrate. The method further includes a step of forming 304 a second dielectric layer over the first dielectric layer. The method further includes a step of forming 306 a second-layer contact extending through the second dielectric layer to the first-layer contact.

According to certain illustrative, a method for forming metal contacts within a semiconductor device includes forming a first-layer contact into a first dielectric layer that surrounds at least one gate electrode, the first-layer contact extending to a doped region of an underlying substrate, forming a second dielectric layer over the first dielectric layer, and forming a second-layer contact extending through the second dielectric layer to the first-layer contact.

According to certain illustrative examples, a semiconductor device includes a substrate that includes a doped region, a first dielectric layer surrounding at least one gate electrode formed on the substrate, the first dielectric layer including a first-layer contact extending to the doped region, and a second dielectric layer formed over the first dielectric layer, the second dielectric layer including a second-layer contact extending through the second dielectric layer to the first-layer contact.

A method for forming metal contacts within a semiconductor device includes forming a gate electrode on a substrate, forming a doped region in the substrate adjacent to the gate electrode, forming a first dielectric layer over the gate electrode, forming a first-layer contact into the first dielectric layer, forming a second dielectric layer over the first dielectric layer, and forming a second-layer contact extending through the second dielectric layer to the first-layer contact such that there is a step between the first-layer contact and the second-layer contact.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method comprising:
    forming a first high-k/metal gate and a second high-k/metal gate over a substrate, wherein a first doped region, a second doped region, and a third doped region are disposed in the substrate, such that the first high-k/metal gate is disposed between and directly adjacent to the first doped region and the second doped region and the second high-k/metal gate is disposed between and directly adjacent to the second doped region and the third doped region, and further wherein the first doped region, the second doped region, and the third doped region each correspond with a source or a drain of a transistor;
    forming a hard mask layer that covers exposed surfaces of the first high-k/metal gate, the second high-k/metal gate, the first doped region, the second doped region, the third doped region, and the substrate;
    forming a first dielectric layer over the hard mask layer, wherein the first dielectric layer is planarized to expose the hard mask layer that covers top surfaces of the first high-k/metal gate and the second high-k/metal gate;
    forming a second dielectric layer over the hard mask layer and the first dielectric layer;
    forming a first contact trench that exposes the first doped region, the second doped region, the third doped region, and a first portion of the hard mask layer that covers the first high-k/metal gate and the second high-k/metal gate, wherein the first contact trench extends through the second dielectric layer, the first dielectric layer, and a second portion of the hard mask layer that covers the first doped region, the second doped region, and the third doped region, and further wherein sidewalls of the first contact trench are defined by the second dielectric layer, the first dielectric layer, and the hard mask layer that covers sidewalls of the first high-k/metal gate and the second high-k/metal gate;
    filling the first contact trench with a first conductive material to form a first contact to the first doped region, a second contact to the second doped region, and a third contact to the third doped region;
    performing a planarization process that completely removes the second dielectric layer and partially removes the first contact, the second contact, and the third contact to expose the hard mask layer that covers the top surfaces of the first high-k/metal gate and the second high-k/metal gate, such that a top surface of the second contact extends from the hard mask layer that covers the top surface of the first high-k/metal gate to the hard mask layer that covers the top surface of the second high-k/metal gate;
    forming a third dielectric layer over the hard mask layer that covers the top surfaces of the first high-k/metal gate and the second high-k/metal gate, the first dielectric layer, the first contact, the second contact, and the third contact;
    forming a second contact trench that exposes the first contact, a third contact trench that exposes the third contact and the second high-k/metal gate, and a fourth contact trench that exposes the first high-k/metal gate, wherein the second contact trench extends through the third dielectric layer, the third contact trench extends through the third dielectric layer and a third portion of the hard mask layer that covers the top surface of the second high-k/metal gate, and the fourth contact trench extends through the third dielectric layer and a fourth portion of the hard mask layer that covers the top surface of the first high-k/metal gate; and
    filling the second contact trench, the third contact trench, and the fourth contact trench with a second conductive material to form a fourth contact to the first contact, a fifth contact to the first high-k/metal gate, and a sixth contact to the third contact and the second high-k/metal gate.

2. The method of claim 1, wherein the fifth contact does not physically contact the first contact, the second contact, or the third contact.

3. The method of claim 1, wherein the first contact trench is formed by etching the second dielectric layer, the first dielectric layer, and the second portion of the hard mask layer using a photoresist pattern.

4. The method of claim 1, further comprising forming an etch stop layer directly on the first dielectric layer and the hard mask layer that covers the top surfaces of the first high-k/metal gate and the second high-k/metal gate.

5. The method of claim 4, wherein the second dielectric layer is formed directly on the etch stop layer.

6. The method of claim 4, wherein the planarization process that completely removes the second dielectric layer and partially removes the first contact, the second contact, and the third contact further completely removes the etch stop layer before forming the third dielectric layer over the first dielectric layer.

7. A method comprising:
    forming a first gate and a second gate over a substrate, wherein a first doped region, a second doped region, and a third doped region are disposed in the substrate, such that the first gate is disposed between the first doped region and the second doped region and the second gate is disposed between the second doped region and the third doped region;
    forming a hard mask layer directly on the first gate, the second gate, the first doped region, the second doped region, the third doped region, and the substrate;
    forming a first dielectric layer over the hard mask layer, wherein the first dielectric layer is planarized to expose the hard mask layer disposed directly on top surfaces of the first gate and the second gate;
    forming a second dielectric layer over the hard mask layer and the first dielectric layer;
    forming a trench that exposes the first doped region, the second doped region, and the third doped region, wherein the forming the trench includes:
        forming a patterning layer over the second dielectric layer, wherein the patterning layer has an opening;
        completely removing the first dielectric layer and the second dielectric layer within the opening, thereby exposing the hard mask layer disposed directly on a first portion of the first gate, a first portion of the second gate, the first doped region, the second doped region, and the third doped region, and removing the hard mask layer within the opening that is disposed directly on the first doped region, the second doped region, and the third doped region;

forming a first contact in the trench that is coupled to the first doped region, the second doped region, and the third doped region, wherein after the forming of the first contact, a top surface of the hard mask layer disposed directly on top surfaces of the first gate and the second gate is substantially coplanar with a top surface of the first contact, and the first contact to the second doped region completely fills a space between the first portion of the first gate and the first portion of the second gate; and forming a second contact that is coupled to a portion of the first contact that is coupled to the first doped region, a third contact that is coupled to a second portion of the first gate, and a fourth contact that is coupled to the first portion of the second gate and a portion of the first contact that is coupled to the third doped region.

8. The method of claim 7, wherein the forming the first contact includes performing a planarization process to completely remove the patterning layer and remaining second dielectric layer, wherein the planarization process exposes the hard mask layer disposed directly on top surfaces of the first gate and the second gate.

9. The method of claim 7, wherein the second contact, third contact, and the fourth contact are formed by the same patterning process.

10. The method of claim 9, wherein the patterning process includes:

forming a third dielectric layer directly on the first contact, the hard mask layer disposed directly on top surfaces of the first gate and the second gate, and the first dielectric layer;

forming a first trench that extends through the third dielectric layer to partially expose the portion of the first contact that is coupled to the first doped region;

forming a second trench that extends through the third dielectric layer and a portion of the hard mask layer to partially expose the top surface of the second portion of the first gate;

forming a third trench that extends through the third dielectric layer and a portion of the hard mask layer to partially expose the top surface of the first portion of the second gate and a the portion of the first contact that is coupled to the third doped region; and filling the first trench, the second trench, and the third trench with a conductive material.

11. The method of claim 10, wherein the first contact, the second contact, the third contact, and the fourth contact include tungsten.

12. The method of claim 10, further comprising performing a chemical mechanical polishing process to remove excessive conductive material.

13. The method of claim 7, further comprising forming an etch stop layer directly on the first dielectric layer and the hard mask layer disposed directly on top surfaces of the first gate and the second gate, and wherein forming the second dielectric layer over the hard mask layer and the first dielectric layer includes forming the second dielectric layer directly on the etch stop layer.

14. The method of claim 7, wherein the second contact has a top width that is substantially the same as a top width of the first contact.

15. A method comprising:

forming a gate over a substrate, wherein the gate is disposed between a first doped region and a second doped region disposed in the substrate;

depositing a hard mask layer that covers exposed surfaces of the gate, the first doped region, and the second doped region;

depositing a first dielectric layer over the hard mask layer;

depositing a second dielectric layer over the first dielectric layer;

etching the first dielectric layer, the second dielectric layer, and the hard mask layer to form a first trench that exposes the first doped region or the second doped region, wherein the gate extends along a first direction and the first trench extends along a second direction that is perpendicular to the first direction;

depositing a first conductive material in the first trench;

planarizing the second dielectric layer and the first conductive material until the hard mask layer that covers a top surface of the gate is exposed, thereby forming a first conductive feature that extends along the second direction, wherein the first conductive feature has a top surface that is substantially coplanar with a top surface of the hard mask layer that covers the top surface of the gate and a top surface of the first dielectric layer;

depositing a third dielectric layer over the first conductive feature, the first dielectric layer, and the hard mask layer that covers the top surface of the gate;

etching the third dielectric layer and the hard mask layer that covers a top surface of the gate to form a second trench that exposes the first conductive feature and a third trench that exposes the gate, wherein a top width of the second trench is substantially the same as a top width of the first conductive feature and a top width of the third trench is substantially the same as the top width of the second trench;

depositing a second conductive material in the second trench and the third trench; and planarizing the third dielectric layer and the second conductive material, thereby forming a second conductive feature disposed directly on the first conductive feature and a third conductive feature disposed directly on the top surface of the gate, wherein a portion of the hard mask layer is disposed between the first conductive feature and the third conductive feature, and further wherein the second conductive feature does not physically contact the third conductive feature.

16. The method of claim 15, wherein no first dielectric layer is disposed between the first conductive feature and the hard mask layer that covers a sidewall of the gate.

17. The method of claim 15, wherein the first conductive feature has a sidewall facing the gate, and wherein the hard mask layer is disposed along an entire length of the sidewall of the first conductive feature.

18. The method of claim 15, wherein a bottom width of the second trench is less than the top width of the first conductive feature.

19. The method of claim 18, wherein a portion of the top surface of the first conductive feature is covered by the third dielectric layer.

20. The method of claim 15, wherein the third conductive feature and the second conductive feature are formed of a different material than the first conductive feature.

* * * * *